United States Patent [19]

Galani et al.

[11] Patent Number: 4,912,432

[45] Date of Patent: Mar. 27, 1990

[54] PLURAL FEEDBACK LOOP DIGITAL FREQUENCY SYNTHESIZER

[75] Inventors: Zvi Galani, Bedford; John A. Chiesa, Dracut; Raymond C. Waterman, Jr., Westford, all of Mass.

[73] Assignee: Raytheon Company, Lexington, Mass.

[21] Appl. No.: 339,534

[22] Filed: Apr. 17, 1989

[51] Int. Cl.$^4$ .......................... H03L 7/18; H03L 7/22
[52] U.S. Cl. ........................................ 331/2; 331/25; 331/31
[58] Field of Search .................. 331/2, 14, 16, 25, 30, 331/31

[56] References Cited

U.S. PATENT DOCUMENTS 3,600,699  8/1971  Orenberg ................................ 331/2

OTHER PUBLICATIONS

Motorola Spec. Sheet for MC12040/MC12540, pp. 6-81 to 6-84.

Primary Examiner—Siegfried H. Grimm
Attorney, Agent, or Firm—Richard M. Sharkansky

[57] ABSTRACT

A multiple feedback loop frequency synthesizer, having a first and a second feedback loop, each fed by one of a pair of reference frequency signals having a frequency separation equal to the desired frequency separation of the output signals provided by the synthesizer. The frequency of each of such reference frequency signals is greater than the desired frequency separation of the output signals provided by the synthesizer. With such arrangement, because the bandwidth of each of the feedback loops must be less than the frequency of the reference frequency signal fed to such loop, achievement of frequency separation less than the frequency of either one of the reference frequencies enables each of the feedback loops to have increased bandwidth and hence reduced frequency switching times and increased noise suppression.

10 Claims, 3 Drawing Sheets

PLURAL FEEDBACK LOOP DIGITAL FREQUENCY SYNTHESIZER

BACKGROUND OF THE INVENTION

This invention relates generally to digital frequency synthesizers and more particularly to indirect digital frequency synthesizers adapted to produce an output signal having a selected frequency within a band of frequencies with predetermined frequency separation.

As is known in the art, digital frequency synthesizers generally fall into two categories: direct frequency synthesizers and indirect frequency synthesizers. Direct synthesizers are typically open-loop configurations using frequency multipliers, frequency dividers, mixers and switches. While offering the advantage of fast frequency switching and generation of closely spaced frequencies, they are relatively hardware intensive and have a tendency of generating an excessive number of spurious signals. Indirect frequency synthesizers on the other hand are feedback loop configurations adapted to produce an output signal having a selected frequency within a spectrum of frequencies with a predetermined frequency separation. In one type of indirect synthesizer, the feedback loop translates a fixed offset frequency $f_{os}$, which is near one end of the operating band, by an amount ($f_T$) required to produce an output signal having the desired frequency, $f_d$, i.e. $f_d = f_{os} \pm f_T$. More particularly, a reference frequency signal having a reference frequency $f_R$ is compared with a feedback signal, derived from the output signal, having a frequency related to the actual amount of frequency translation ($f'_T$) provided to produce the output signal. As a result of this comparison, an error signal is produced which drives a voltage controlled oscillator (VCO) such that, in the steady state, the actual amount of frequency translation provided to the output signal ($f'_T$) is equal to the required amount of frequency translation ($f_T$) to produce the desired output frequency, $f_d$. To provide rapid, accurate response a phase-lock loop is used for the feedback loop. In such phase-lock loop the feedback signal is fed to a programmable frequency divider prior to being compared with the frequency of the reference frequency signal. The division ratio N of the frequency divider is selected in response to a signal representative of the desired frequency, so that N is the ratio of the required translation frequency $f_T$ to the reference frequency $f_R$ i.e. $N = f_T / f_R$. Thus, in the steady state, the error signal produced by a phase detector drives the VCO so that in the steady state $f_d = f_{os} \pm N f_R$ depending on whether the offset frequency is near the lower, or upper, end of the frequency band, respectively. More particularly, the offset frequency signal is mixed with the output signal of the phase-lock loop to produce, in the steady state, the feedback signal having the translation frequency $f_T$. The frequency of the feedback signal is divided by the integer N, selected in response to the frequency select input signal, such that $N = f_T / f_R$. Therefore, if the desired output frequency is $f_d$, and assuming the offset frequency $f_{os}$ is below the lower end of the spectrum, $N = (f_d - f_{os})/f_R$. It follows that since N is an integer the minimum frequency separation attainable with such synthesizer is $f_R$, the frequency of the reference frequency signal. An advantage of the indirect frequency synthesizer of this type s that spurious signal levels are reduced because of the low pass filtering action of the feedback loop. A disadvantage, however, is its longer frequency switching time compared with the switching time of a direct frequency synthesizer.

While such an indirect digital frequency synthesizer may be adequate in some applications it requires that the highest operating frequency of the programmable frequency divider generally be equal to, or greater than, the highest translation frequency $f_T$. However, because commercially available digital frequency dividers have a fixed highest operating frequency, such synthesizer may, therefore, be limited in its application. One type of indirect digital synthesizer which reduces the required highest operating frequency of the divider by placing the offset frequency near the middle of the desired frequency range $f_d$ is described in copending application Ser. No. 07/272,044, inventors Zvi Galani, Malcolm E. Skinner, and John A. Chiesa, filed Nov. 16, 1988, and assigned to the same assignee as the present invention.

Figure 1:
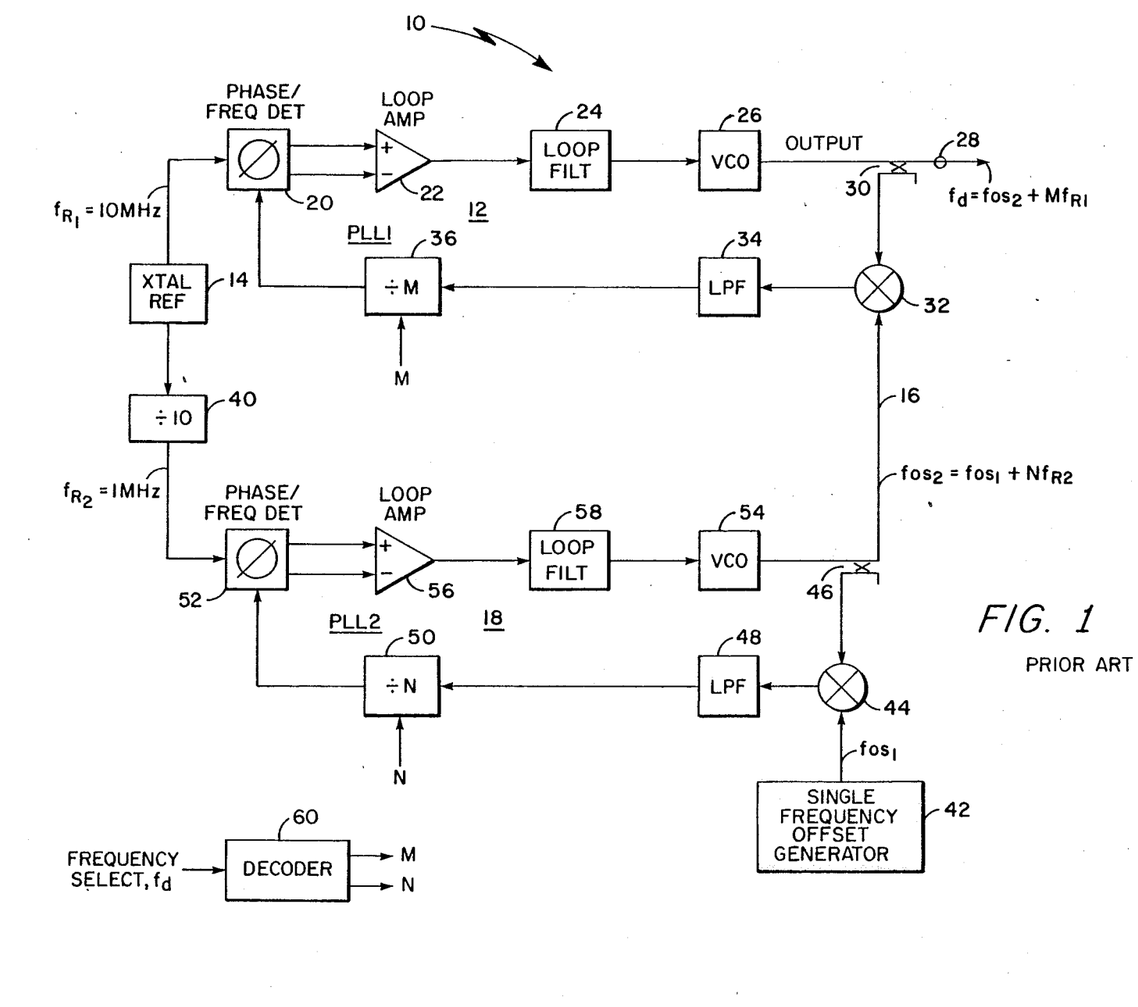
FIG. 1 is a block diagram of an indirect digital frequency synthesizer according to the prior art.

In still another type of indirect digital frequency synthesizer, a second phase-lock loop is provided for use in applications requiring closely spaced frequencies without high frequency division ratios. More specifically, a second phase-lock loop is used to synthesize a second offset frequency $f_{os2}$ used by the first, or main phase lock loop. Such arrangement is shown in FIG. 1, where an indirect digital frequency synthesizer 10 is shown here to produce an output signal having a frequency within a band of 400 frequencies with a 1 MHz frequency separation. Thus, here synthesizer 10 is shown to include a first phase-lock loop 12. The first phase lock loop 12 (PLL1) is fed by a first reference frequency signal having a frequency $f_{R1}$, here 10 MHZ, provided by a crystal oscillator 14 and the second offset frequency signal on line 16 having a frequency $f_{os2}$ synthesized in a manner to be described hereinafter by a second phase-lock loop 18. The first phase-lock loop 12 includes a phase/frequency detector 20, the output of which, after being amplified by loop amplifier 22 and filtered by filter 24, drives a voltage controlled oscillator (VCO) 26. The phase/frequency detector 20 is here a model MC12040 sold by Motorola, Phoenix, Ariz. and includes appropriate filtering at its output to produce a signal representative of the phase between two signals fed thereto. When a first one of the fed signals leads a second one of the fed signals, a first one of a pair of outputs of the detector 20 produces a voltage proportional to the phase between the two fed signals while the second one of the pair of outputs is zero, whereas when the first one of the fed signals lags the second one of the fed signals the first one of the outputs is zero, and the second one of the pair of outputs produces a voltage proportional to the phase between the two fed signals. The VCO 26 produces an output signal at output port 28 having, in the steady state, the desired frequency $f_d$. A portion of the output signal is fed, via a directional coupler 30, to a mixer 32. Also fed to mixer 32 is the second offset frequency signal synthesized by the second phase-lock loop 18. The resulting beat frequency, feedback signal is passed through low pass filter 34 to a programmable frequency divider 36. The output of divider 36 is fed to the phase/frequency detector 20, as shown. Likewise the second phase-lock loop 18 (PLL2) is fed by: a second reference frequency signal, having a frequency $f_{R2}$, here a 1 MHZ, produced by passing the 10 MHZ reference input frequency signal produced by crystal oscillator 14 through a frequency divider 40, here a 10:1 frequency divider; and, a first offset frequency generator 42. The first offset frequency generator 42 produces a signal having an output frequency $f_{osl}$ either above the upper, or below the lower end of the band of frequencies being synthesized (here below the lower end of the band). A portion of the signal synthesized by the second phase-lock loop 18 (for use as the second offset frequency of the first phase-lock loop 12) is coupled to a second mixer 44 via a directional coupler 46 along with the first offset frequency signal produced by generator 42. Thus the beat frequency feedback signal produced by the second mixer 44 and fed through low pass filter 48 is coupled to a second programmable frequency divider 50. The signal produced by the second programmable frequency divider 50 is fed to the phase/frequency detector 52 along with the 1 MHZ second reference frequency signal provided by the 10:1 frequency divider 40. The signal produced by the second phase/frequency detector 52 is fed to a second VCO 54 via loop amplifier 56 and filter 58. The signal produced by this second VCO 54 is fed to the first mixer 32, via line 16, and to the second mixer 44 via directional coupler 46. Completing the synthesizer 10 is a decoder 60, here including a conventional read only memory (ROM) which, in response to a digital word representative of the desired frequency $f_d$ to be synthesized, produces digital commands representative of the integer division ratios M and N for the first programmable frequency divider 36 and the second programmable frequency divider 50, respectively. It follows then that, in the steady state, the frequency of the second offset frequency signal produced by the second phase-lock loop 18 on line 16 will be $f_{os2}=f_{os1}+Nf_{R2}$. Therefore, in the steady state, the frequency of the output signal at output port 28 will be $f_d=f_{os2}+Mf_{R1}=f_{os1}+Nf_{R2}+Mf_{R1}=f_{os1}+(N)MHZ+(10M)MHZ$. The data stored in the decoder 60 to generate the desired frequency $f_d$ is presented in Table I below:

TABLE I $f_d = (f_T + f_{osl}) = f_{osl} + (10M + N)MHZ$

| $f_d$(MHZ) | 0 | | 1 | | 2 | | 3 | | 4 | | 5 | | 6 | | 7 | | 8 | | 9 | |
|---|---|---|---|---|---|---|---|---|---|---|---|---|---|---|---|---|---|---|---|---|
| | M | N | M | N | M | N | M | N | M | N | M | N | M | N | M | N | M | N | M | N |
| $f_{osl}$ +10  | —  | —  | 1  | 1  | 1  | 2  | 1  | 3  | 1  | 4  | 1  | 5  | 1  | 6  | 1  | 7  | 1  | 8  | 1  | 9 |
| $f_{osl}$ +20  | 1  | 10 | 2  | "  | 2  | "  | 2  | "  | 2  | "  | 2  | "  | 2  | "  | 2  | "  | 2  | "  | 2  | " |
| $f_{osl}$ +30  | 2  | 10 | 3  | "  | 3  | "  | 3  | "  | 3  | "  | 3  | "  | 3  | "  | 3  | "  | 3  | "  | 3  | " |
| $f_{osl}$ +40  | 3  | "  | 4  | "  | 4  | "  | 4  | "  | 4  | "  | 4  | "  | 4  | "  | 4  | "  | 4  | "  | 4  | " |
| $f_{osl}$ +50  | 4  | "  | 5  | "  | 5  | "  | 5  | "  | 5  | "  | 5  | "  | 5  | "  | 5  | "  | 5  | "  | 5  | " |
| $f_{osl}$ +60  | 5  | "  | 6  | "  | 6  | "  | 6  | "  | 6  | "  | 6  | "  | 6  | "  | 6  | "  | 6  | "  | 6  | " |
| $f_{osl}$ +70  | 6  | "  | 7  | "  | 7  | "  | 7  | "  | 7  | "  | 7  | "  | 7  | "  | 7  | "  | 7  | "  | 7  | " |
| $f_{osl}$ +80  | 7  | "  | 8  | "  | 8  | "  | 8  | "  | 8  | "  | 8  | "  | 8  | "  | 8  | "  | 8  | "  | 8  | " |
| $f_{osl}$ +90  | 8  | "  | 9  | "  | 9  | "  | 9  | "  | 9  | "  | 9  | "  | 9  | "  | 9  | "  | 9  | "  | 9  | " |
| $f_{osl}$ +100 | 9  | "  | 10 | "  | 10 | "  | 10 | "  | 10 | "  | 10 | "  | 10 | "  | 10 | "  | 10 | "  | 10 | " |
| $f_{osl}$ +110 | 10 | "  | 11 | "  | 11 | "  | 11 | "  | 11 | "  | 11 | "  | 11 | "  | 11 | "  | 11 | "  | 11 | " |
| $f_{osl}$ +120 | 11 | "  | 12 | "  | 12 | "  | 12 | "  | 12 | "  | 12 | "  | 12 | "  | 12 | "  | 12 | "  | 12 | " |
| $f_{osl}$ +130 | 12 | "  | 13 | "  | 13 | "  | 13 | "  | 13 | "  | 13 | "  | 13 | "  | 13 | "  | 13 | "  | 13 | " |
| $f_{osl}$ +140 | 13 | "  | 14 | "  | 14 | "  | 14 | "  | 14 | "  | 14 | "  | 14 | "  | 14 | "  | 14 | "  | 14 | " |
| $f_{osl}$ +150 | 14 | "  | 15 | "  | 15 | "  | 15 | "  | 15 | "  | 15 | "  | 15 | "  | 15 | "  | 15 | "  | 15 | " |
| $f_{osl}$ +160 | 15 | "  | 16 | "  | 16 | "  | 16 | "  | 16 | "  | 16 | "  | 16 | "  | 16 | "  | 16 | "  | 16 | " |
| $f_{osl}$ +170 | 16 | "  | 17 | "  | 17 | "  | 17 | "  | 17 | "  | 17 | "  | 17 | "  | 17 | "  | 17 | "  | 17 | " |
| $f_{osl}$ +180 | 17 | "  | 18 | "  | 18 | "  | 18 | "  | 18 | "  | 18 | "  | 18 | "  | 18 | "  | 18 | "  | 18 | " |
| $f_{osl}$ +190 | 18 | "  | 19 | "  | 19 | "  | 19 | "  | 19 | "  | 19 | "  | 19 | "  | 19 | "  | 19 | "  | 19 | " |
| $f_{osl}$ +200 | 19 | "  | 20 | "  | 20 | "  | 20 | "  | 20 | "  | 20 | "  | 20 | "  | 20 | "  | 20 | "  | 20 | " |
| $f_{osl}$ +210 | 20 | "  | 21 | "  | 21 | "  | 21 | "  | 21 | "  | 21 | 6  | 21 | "  | 21 | "  | 21 | "  | 21 | " |
| $f_{osl}$ +220 | 21 | "  | 22 | "  | 22 | "  | 22 | "  | 22 | "  | 22 | "  | 22 | "  | 22 | "  | 22 | "  | 22 | " |
| $f_{osl}$ +230 | 22 | 10 | 23 | 1  | 23 | 2  | 23 | 3  | 23 | 4  | 23 | 5  | 23 | 6  | 23 | 7  | 23 | 8  | 23 | 9 |
| $f_{osl}$ +240 | 23 | "  | 24 | "  | 24 | "  | 24 | "  | 24 | "  | 24 | "  | 24 | "  | 24 | "  | 24 | "  | 24 | " |
| $f_{osl}$ +250 | 24 | "  | 25 | "  | 25 | "  | 25 | "  | 25 | "  | 25 | "  | 25 | "  | 25 | "  | 25 | "  | 25 | " |
| $f_{osl}$ +260 | 25 | "  | 26 | "  | 26 | "  | 26 | "  | 26 | "  | 26 | "  | 26 | "  | 26 | "  | 26 | "  | 26 | " |
| $f_{osl}$ +270 | 26 | "  | 27 | "  | 27 | "  | 27 | "  | 27 | "  | 27 | "  | 27 | "  | 27 | "  | 27 | "  | 27 | " |
| $f_{osl}$ +280 | 27 | "  | 28 | "  | 28 | "  | 28 | "  | 28 | "  | 28 | "  | 28 | "  | 28 | "  | 28 | "  | 28 | " |
| $f_{osl}$ +290 | 28 | "  | 29 | "  | 29 | "  | 29 | "  | 29 | "  | 29 | "  | 29 | "  | 29 | "  | 29 | "  | 29 | " |
| $f_{osl}$ +300 | 29 | "  | 30 | "  | 30 | "  | 30 | "  | 30 | "  | 30 | "  | 30 | "  | 30 | "  | 30 | "  | 30 | " |
| $f_{osl}$ +310 | 30 | "  | 31 | "  | 31 | "  | 31 | "  | 31 | "  | 31 | "  | 31 | "  | 31 | "  | 31 | "  | 31 | " |
| $f_{osl}$ +320 | 31 | "  | 32 | "  | 32 | "  | 32 | "  | 32 | "  | 32 | "  | 32 | "  | 32 | "  | 32 | "  | 32 | " |
| $f_{osl}$ +330 | 32 | "  | 33 | "  | 33 | "  | 33 | "  | 33 | "  | 33 | "  | 33 | "  | 33 | "  | 33 | "  | 33 | " |
| $f_{osl}$ +340 | 33 | "  | 34 | "  | 34 | "  | 34 | "  | 34 | "  | 34 | "  | 34 | "  | 34 | "  | 34 | "  | 34 | " |
| $f_{osl}$ +350 | 34 | "  | 35 | "  | 35 | "  | 35 | "  | 35 | "  | 35 | "  | 35 | "  | 35 | "  | 35 | "  | 35 | " |
| $f_{osl}$ +360 | 35 | "  | 36 | "  | 36 | "  | 36 | "  | 36 | "  | 36 | "  | 36 | "  | 36 | "  | 36 | "  | 36 | " |
| $f_{osl}$ +370 | 36 | "  | 37 | "  | 37 | "  | 37 | "  | 37 | "  | 37 | "  | 37 | "  | 37 | "  | 37 | "  | 37 | " |
| $f_{osl}$ +380 | 37 | "  | 38 | "  | 38 | "  | 38 | "  | 38 | "  | 38 | "  | 38 | "  | 38 | "  | 38 | "  | 38 | " |
| $f_{osl}$ +390 | 38 | "  | 39 | "  | 39 | 2  | 39 | 3  | 39 | 4  | 39 | 5  | 39 | 6  | 39 | 7  | 39 | 8  | 39 | 9 |
| $f_{osl}$ +400 | 39 | 10 | 40 | 1  | —  | —  | —  | —  | —  | —  | —  | —  | —  | —  | —  | —  | —  | —  | —  | — |

Thus, for example, if the desired frequency, $f_d$, to be synthesized is $f_{os1}+235$ MHZ from Table I, M=23 and N=5. From FIG. 1, it follows that the frequency of the signal fed to the second programmable frequency divider 50, in the steady state, will be 5 MHZ and the VCO 54 will produce a signal having a frequency $f_{os2}=f_{os1}+Nf_{R2}=f_{os1}+5$ MHZ. This signal is fed via line 16 to the first phase-lock loop 12 and hence the frequency of the signal fed to the first programmable frequency divider 36 will be, in the steady state, $Mf_{R1}=230$ MHZ with the result that the VCO 26 will produce an output signal having the desired frequency $f_{os1}+235$ MHZ. Thus the pair of phase-lock loops 12, 18 translate the first offset frequency $f_{os1}$ an amount $f_T=Mf_{R1}+Nf_{R2}=235$ MHZ. Here, the bandwidth of the translation frequency $f_T$ is 400MHZ. Further the frequency separation is thus equal to the frequency of the second reference frequency $f_{R2}$, here the 1 MHZ signal fed to the second phase/frequency detector 52 of the second phase-lock loop 18. As is also known, the bandwidth of a phase-lock loop must be substantially smaller than the frequency of the reference frequency signal fed to such loop so that the loop provides adequate attenuation to the reference frequency signal leaking into the loop. Therefore, smaller frequency separation leads to narrower bandwidth phase-lock loops with the concommitant effect of increasing frequency switching time.

SUMMARY OF THE INVENTION

With this background of the invention in mind, it is therefore an object of this invention to provide an improved digital frequency synthesizer.

It is another object of this invention to provide an improved indirect digital frequency synthesize adapted to produce a signal having a selected one of a plurality of relatively closely spaced frequencies and having a relatively fast frequency switching time.

These and other objects of the invention are attained generally by providing a multiple feedback loop frequency synthesizer fed by reference frequency signals, the frequency of such reference frequency signals being greater than the desired frequency separation provided by the synthesizer. With such arrangement, because the bandwidth of each of the feedback loops must be less than the frequency of the reference frequency signal fed to such loop, achievement of frequency separation less than the frequency of either one of the reference frequencies enables each of the feedback loops to have increased bandwidth and hence reduced frequency switching times and increased noise suppression.

BRIEF DESCRIPTION OF THE DRAWINGS

The foregoing features of this invention, as well as the invention itself, may be more fully understood from the following detailed description read together with the accompanying drawings, in which.

DESCRIPTION OF THE PREFERRED EMBODIMENTS

Figure 2:
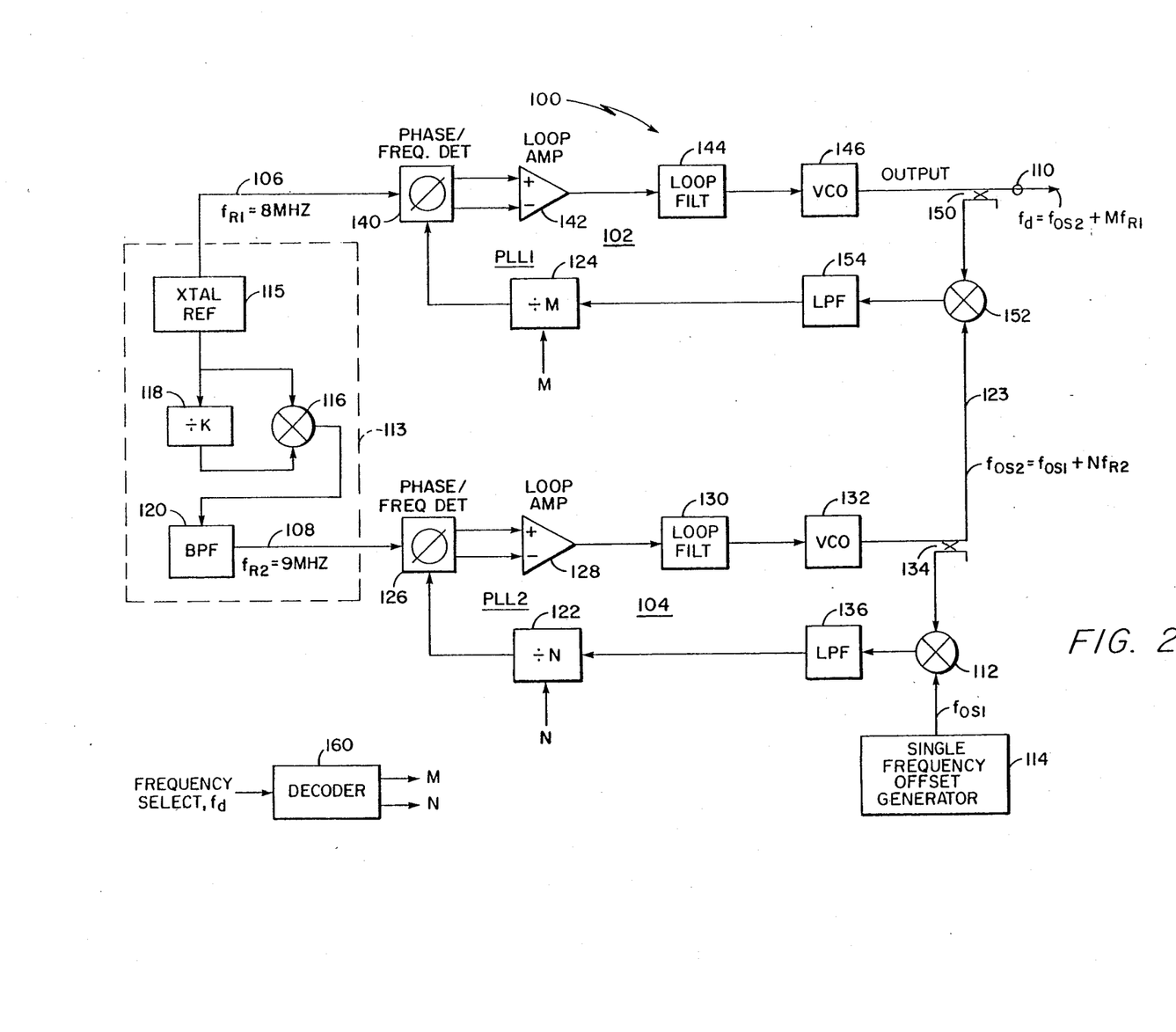
FIG. 2 is a block diagram of an indirect digital frequency synthesizer according to the invention.

Referring now to FIG. 2 an indirect digital frequency synthesizer 100 is shown to include a pair of feedback loops, here phase-lock loops 102, 104, (PLL1, PLL2), fed by a pair of reference frequency signals having frequencies $f_{R1}$ and $f_{R2}$, respectively via lines 106, 108, respectively. The digital frequency synthesizer 100 is adapted to produce an output signal at output port 110 having a selected one of a plurality of closely spaced frequencies within a predetermined band of frequencies; the spacing of such frequencies being less than the frequencies $f_{R1}$, $f_{R2}$ of the pair of reference frequency signals. Here the predetermined band of frequencies extends from a frequency $f_{os1}$ to $f_{os1} + f_T$ and the separation in the frequencies in the band is $\Delta f$. Thus $f_{R1}$ is greater than $\Delta f$ and $f_{R2}$ is greater than $\Delta f$. With such arrangement, therefore, even though the phase-lock loops 102, 104 must have bandwidths less than the reference frequencies $f_{R1}$, $f_{R2}$, respectively, fed to such loops in order to provide adequate attenuation to the reference frequency signals leaking into such loops, the frequency separation is here less than the frequency of either one of the pair of reference frequency signals, and the bandwidths of the loops are therefore sufficiently large to provide rapid frequency switching. For example, here the first reference frequency signal fed to the first phase-lock loop 102 via line 106 is 8 MHZ, and the frequency of the second reference frequency signal fed to the second phase-lock loop 104 via line 108 is 9 MHZ while the frequency separation provided by synthesizer 100 is 1 MHZ. Thus, here the bandwidth of the second phase-lock loop 104 (FIG. 2) would generally be 9 times greater than the bandwidth of the prior art second phase-lock loop 18, (FIG. 1) and hence the synthesizer 100 (FIG. 2) has faster frequency switching as compared with the prior art synthesizer 10 (FIG. 1) even though both synthesizers 10, 100 provide the same 1 MHZ frequency separation.

Referring now in more detail to the second phase-lock loop 104 (FIG. 2), such loop 104 includes a mixer 112 fed by an offset frequency signal produced by a frequency generator 114. The frequency $f_{os1}$ of the offset frequency signal is either above the upper, or below the lower end of the band of frequencies synthesizable by loop 104, here such frequency is below the lower end of the band. The first and second reference frequency signals produced on lines 106, 108 are generated by a reference frequency generator 113. More particularly, here, for example, the first reference frequency signal, having the frequency $f_{R1}$, is derived directly from a crystal oscillator 115. The second reference frequency signal having the frequency $f_{R2}$ is derived indirectly by passing a portion of the first reference frequency signal produced by such oscillator 115, (having the frequency $f_{R1}$) to both a mixer 116 and a frequency divider 118. The output of the divider 118 is also fed to the mixer 116. The frequency of the signal produced by feeding the output of mixer 116 through a band-pass filter 120 (here a filter which passes the upper sideband frequency) is thus $f_{R1} + (f_{R1}/K) = f_{R2}$, where K is the division integer of the divider 118. If $K = f_{R1}/(1 \text{ MHZ})$, $f_{R2} - f_{R1} =$ the desired frequency spacing, here 1 MHZ. Thus, since here $f_{R1}$ is 8 MHZ, $\Delta f = 1$ MHZ, $K = 8$ and $f_{R2} = 9$ MHZ. Thus, it is noted that the reference frequency signals fed to both loops 102 and 104 are greater than the 1 MHZ frequency separation. The second reference frequency signal, having the frequency $f_{R2}$, here 9 MHZ, is fed to the second phase-lock loop 104 and the 8 MHZ first reference frequency signal produced by the crystal oscillator 115 is fed as the first reference frequency signal for the first phase-lock loop 102. The function of the second phase lock loop 104 is to translate the frequency $f_{os1}$ of the offset frequency signal by N $f_{R2}$, where N is the division ratio of the programmable frequency divider 122 (that is, here translate the frequency of the offset frequency $f_{os1}$ higher by $Nf_{R2}$) while the function of the first phase-lock loop 102 is to translate the frequency, $f_{os2}$, of the output of the second phase-lock loop 104 (and fed to the first phase-lock loop 102 via line 123) an amount $Mf_{R1}$, where M is the division ratio of the programmable frequency divider 124, (that is, here also translate such frequency $f_{os2}$ higher by $Mf_{R1}$). The result is that the frequency of the signal produced at output 110, in the steady state, will be is $f_d = f_{os1} + f_T$ where $f_T = 9N + 8M$.

The second feedback loop, here phase lock loop 104, includes a phase/frequency detector 126 for comparing the phase of the 9 MHZ second reference frequency signal with the phase of a 9 MHZ signal produced by programmable divider 122. The output of the phase/frequency detector 126 is fed through a loop amplifier 128 and filter 130 to provide the control signal for a voltage controlled oscillator (VCO) 132. A portion of the signal produced at the output of VCO 132 is fed, via directional coupler 134, to mixer 112 and to mixer 152 of the first phase-lock loop 102. The beat frequency signal produced by passing the output of mixer 112 through low pass filter 136 is fed as an input to the programmable frequency divider 122. It follows then that, in the steady state, the second phase-lock loop 104 will track the frequency of the signal produced by the VCO 132 to maintain it at a frequency $f_{os1}+(9N)$MHZ, where, as mentioned above, N is the division ratio of the programmable frequency divider 122.

Likewise the first phase-lock loop 102 includes a phase/frequency detector 140 fed, via line 106, by the first reference frequency signal produced by the crystal oscillator 115 and by the 8 MHZ signal produced by the programmable frequency divider 124. The output of the phase/frequency detector 140 is fed, via amplifier 142 and filter 144, to voltage controlled oscillator (VCO) 146. A portion of the signal produced at the output of VCO 146 is fed, via directional coupler 150, to mixer 152 and to output port 110. Also fed to mixer 152, via line 123, is a portion of the signal produced by VCO 132. Thus, the beat frequency signal produced by passing the output of mixer 152 through low pass filter 154 is fed to the input of the programmable frequency divider 124 so that, in the steady state, the phase-lock loop 102 maintains the frequency of the signal produced by the VCO 146 at $f_d=f_{os1}+f_T$ where $f_T=(8M)$MHZ$+(9N)$MHZ, and where M is the division ratio of the programmable frequency divider 124.

Completing the frequency synthesizer 100 is a decoder 160, here including a conventional read only memory, programmed to produce digital commands representative of the integer division ratios M and N in response to an applied digital word representative of the desired frequency $f_d$. The data stored in decoder 160 to generate the desired frequency $f_d$ is presented in Table II below:

TABLE II $f_d = f_{os1} + (8M + 9N)$MHZ

| | \multicolumn{20}{c}{$f_d$(MHZ)} |
|---|---|---|---|---|---|---|---|---|---|---|---|---|---|---|---|---|---|---|---|---|
| | 0 | | 1 | | 2 | | 3 | | 4 | | 5 | | 6 | | 7 | | 8 | | 9 | |
| | M | N | M | N | M | N | M | N | M | N | M | N | M | N | M | N | M | N | M | N |
| $f_{os1}+70$ | | | | | | | 8 | 1 | 7 | 2 | 6 | 3 | 5 | 4 | 4 | 5 | 3 | 6 | 2 | 7 |
| $f_{os1}+80$ | 1 | 8 | 8 | 1 | 8 | 2 | 7 | 3 | 6 | 4 | 5 | 5 | 4 | 6 | 3 | 7 | 2 | 8 | 1 | 9 |
| $f_{os1}+90$ | 9 | 2 | 8 | 3 | 7 | 4 | 6 | 5 | 5 | 6 | 4 | 7 | 3 | 8 | 2 | 9 | 1 | 10 | 9 | 3 |
| $f_{os1}+100$ | 8 | 4 | 7 | 5 | 6 | 6 | 5 | 7 | 4 | 8 | 3 | 9 | 2 | 10 | 10 | 3 | 9 | 4 | 8 | 5 |
| $f_{os1}+110$ | 7 | 6 | 6 | 7 | 5 | 8 | 4 | 9 | 3 | 10 | 2 | 11 | 10 | 4 | 9 | 5 | 8 | 6 | 7 | 7 |
| $f_{os1}+120$ | 6 | 8 | 5 | 9 | 4 | 10 | 3 | 11 | 11 | 4 | 10 | 5 | 9 | 6 | 8 | 7 | 7 | 8 | 6 | 9 |
| $f_{os1}+130$ | 5 | 10 | 4 | 11 | 3 | 12 | 11 | 5 | 10 | 6 | 9 | 7 | 8 | 8 | 7 | 9 | 6 | 10 | 5 | 11 |
| $f_{os1}+140$ | 4 | 12 | 12 | 5 | 11 | 6 | 10 | 7 | 9 | 8 | 8 | 9 | 7 | 10 | 6 | 11 | 5 | 12 | 4 | 13 |
| $f_{os1}+150$ | 12 | 6 | 11 | 7 | 10 | 8 | 9 | 9 | 8 | 10 | 7 | 11 | 6 | 12 | 5 | 13 | 13 | 6 | 12 | 7 |
| $f_{os1}+160$ | 11 | 8 | 10 | 9 | 9 | 10 | 8 | 11 | 7 | 12 | 6 | 13 | 5 | 14 | 13 | 7 | 12 | 8 | 11 | 9 |
| $f_{os1}+170$ | 10 | 10 | 9 | 11 | 8 | 12 | 7 | 13 | 6 | 14 | 14 | 7 | 13 | 8 | 12 | 9 | 11 | 10 | 10 | 11 |
| $f_{os1}+180$ | 9 | 12 | 8 | 13 | 7 | 14 | 6 | 15 | 14 | 8 | 13 | 9 | 12 | 10 | 11 | 11 | 10 | 12 | 9 | 13 |
| $f_{os1}+190$ | 8 | 14 | 7 | 15 | 15 | 8 | 14 | 9 | 13 | 10 | 12 | 11 | 11 | 12 | 10 | 13 | 9 | 14 | 8 | 15 |
| $f_{os1}+200$ | 7 | 16 | 15 | 9 | 14 | 10 | 13 | 11 | 12 | 12 | 11 | 13 | 10 | 14 | 9 | 15 | 8 | 18 | 16 | 9 |
| $f_{os1}+210$ | 15 | 10 | 14 | 11 | 13 | 12 | 12 | 13 | 11 | 14 | 10 | 15 | 9 | 16 | 8 | 17 | 16 | 10 | 15 | 11 |
| $f_{os1}+220$ | 14 | 12 | 13 | 13 | 12 | 14 | 11 | 15 | 10 | 16 | 9 | 17 | 17 | 10 | 16 | 11 | 15 | 12 | 14 | 13 |
| $f_{os1}+230$ | 13 | 14 | 12 | 15 | 11 | 16 | 10 | 17 | 9 | 18 | 17 | 11 | 16 | 12 | 15 | 13 | 14 | 14 | 13 | 15 |
| $f_{os1}+240$ | 12 | 16 | 11 | 17 | 10 | 18 | 18 | 11 | 17 | 12 | 16 | 13 | 15 | 14 | 14 | 15 | 13 | 16 | 12 | 17 |
| $f_{os1}+250$ | 11 | 18 | 10 | 19 | 18 | 12 | 17 | 13 | 16 | 14 | 15 | 15 | 14 | 16 | 13 | 17 | 12 | 18 | 11 | 19 |
| $f_{os1}+260$ | 19 | 12 | 18 | 13 | 17 | 14 | 16 | 15 | 15 | 16 | 14 | 17 | 13 | 18 | 12 | 19 | 11 | 20 | 19 | 13 |
| $f_{os1}+270$ | 18 | 14 | 17 | 15 | 16 | 16 | 15 | 17 | 14 | 18 | 13 | 19 | 12 | 20 | 20 | 13 | 19 | 14 | 18 | 15 |
| $f_{os1}+280$ | 17 | 16 | 16 | 17 | 15 | 18 | 14 | 19 | 13 | 20 | 12 | 21 | 20 | 14 | 19 | 15 | 18 | 16 | 17 | 17 |
| $f_{os1}+290$ | 16 | 18 | 15 | 19 | 14 | 20 | 13 | 21 | 21 | 14 | 20 | 15 | 19 | 16 | 18 | 17 | 17 | 18 | 16 | 19 |
| $f_{os1}+300$ | 15 | 20 | 14 | 21 | 13 | 22 | 21 | 15 | 20 | 15 | 19 | 17 | 18 | 18 | 17 | 19 | 16 | 20 | 15 | 21 |
| $f_{os1}+310$ | 14 | 22 | 22 | 15 | 21 | 18 | 20 | 17 | 19 | 18 | 18 | 19 | 17 | 20 | 16 | 21 | 15 | 22 | 14 | 23 |
| $f_{os1}+320$ | 22 | 16 | 21 | 17 | 20 | 18 | 19 | 19 | 18 | 20 | 17 | 21 | 16 | 22 | 15 | 23 | 23 | 16 | 22 | 17 |
| $f_{os1}+330$ | 21 | 18 | 20 | 19 | 19 | 20 | 18 | 21 | 17 | 22 | 16 | 23 | 15 | 24 | 23 | 17 | 22 | 18 | 21 | 19 |
| $f_{os1}+340$ | 20 | 20 | 19 | 21 | 18 | 22 | 17 | 23 | 16 | 24 | 24 | 17 | 23 | 18 | 22 | 19 | 21 | 20 | 20 | 21 |
| $f_{os1}+350$ | 19 | 22 | 18 | 23 | 17 | 24 | 16 | 25 | 24 | 18 | 23 | 18 | 22 | 20 | 21 | 21 | 20 | 22 | 19 | 23 |
| $f_{os1}+360$ | 18 | 24 | 17 | 25 | 25 | 18 | 24 | 19 | 23 | 20 | 22 | 21 | 21 | 22 | 20 | 23 | 19 | 24 | 18 | 25 |
| $f_{os1}+370$ | 17 | 26 | 25 | 18 | 24 | 20 | 23 | 21 | 22 | 22 | 21 | 23 | 20 | 24 | 19 | 25 | 18 | 26 | 26 | 19 |
| $f_{os1}+380$ | 25 | 20 | 24 | 21 | 23 | 22 | 22 | 23 | 21 | 24 | 20 | 25 | 19 | 26 | 18 | 27 | 26 | 20 | 25 | 21 |
| $f_{os1}+390$ | 24 | 22 | 23 | 23 | 22 | 24 | 21 | 25 | 20 | 26 | 19 | 27 | 27 | 20 | 26 | 21 | 25 | 22 | 24 | 23 |
| $f_{os1}+400$ | 23 | 24 | 22 | 25 | 21 | 26 | 20 | 27 | 19 | 28 | 27 | 21 | 26 | 22 | 25 | 23 | 24 | 24 | 23 | 25 |
| $f_{os1}+410$ | 22 | 26 | 21 | 27 | 20 | 28 | 28 | 21 | 27 | 22 | 26 | 23 | 25 | 24 | 24 | 25 | 23 | 26 | 22 | 27 |
| $f_{os1}+420$ | 21 | 28 | 20 | 29 | 28 | 22 | 27 | 23 | 26 | 24 | 25 | 25 | 24 | 26 | 23 | 27 | 22 | 28 | 21 | 29 |
| $f_{os1}+430$ | 29 | 22 | 28 | 23 | 27 | 24 | 26 | 25 | 25 | 26 | 24 | 27 | 23 | 28 | 22 | 29 | 21 | 30 | 29 | 23 |
| $f_{os1}+440$ | 28 | 24 | 27 | 25 | 26 | 26 | 25 | 27 | 24 | 28 | 23 | 29 | 22 | 30 | 30 | 23 | 29 | 24 | 28 | 25 |
| $f_{os1}+450$ | 27 | 26 | 26 | 27 | 25 | 28 | 24 | 29 | 23 | 30 | 22 | 31 | 30 | 24 | 29 | 25 | 28 | 26 | 27 | 27 |
| $f_{os1}+460$ | 26 | 28 | 25 | 29 | 24 | 30 | 23 | 31 | 31 | 24 | 30 | 25 | 29 | 26 | 28 | 27 | 27 | 28 | 26 | 29 |
| $f_{os1}+470$ | 25 | 30 | 24 | 31 | 23 | 32 | | | | | | | | | | | | | | |

It is first noted that not all of the first 73 translation frequencies can be synthesized. A solution to the problem is to move the offset frequency, $f_{os1}$, 73 MHZ below the lowest output frequency. Assuming for example that the range of desired output frequencies to be produced by synthesizer 100 is frequency $f_d=8001$ MHZ to 8400 MHZ. The offset frequency generator is selected to produce an output signal having an offset frequency $f_{os1}=8001$ MHZ$-73$ MHZ$=7928$ MHZ. Thus, if for example, the desired output signal is to have a frequency $f_d=8210$ MHZ from Table II, $f_d=f_{os1}+282$ MHZ and thus M=15 and N=18.

Figure 3:
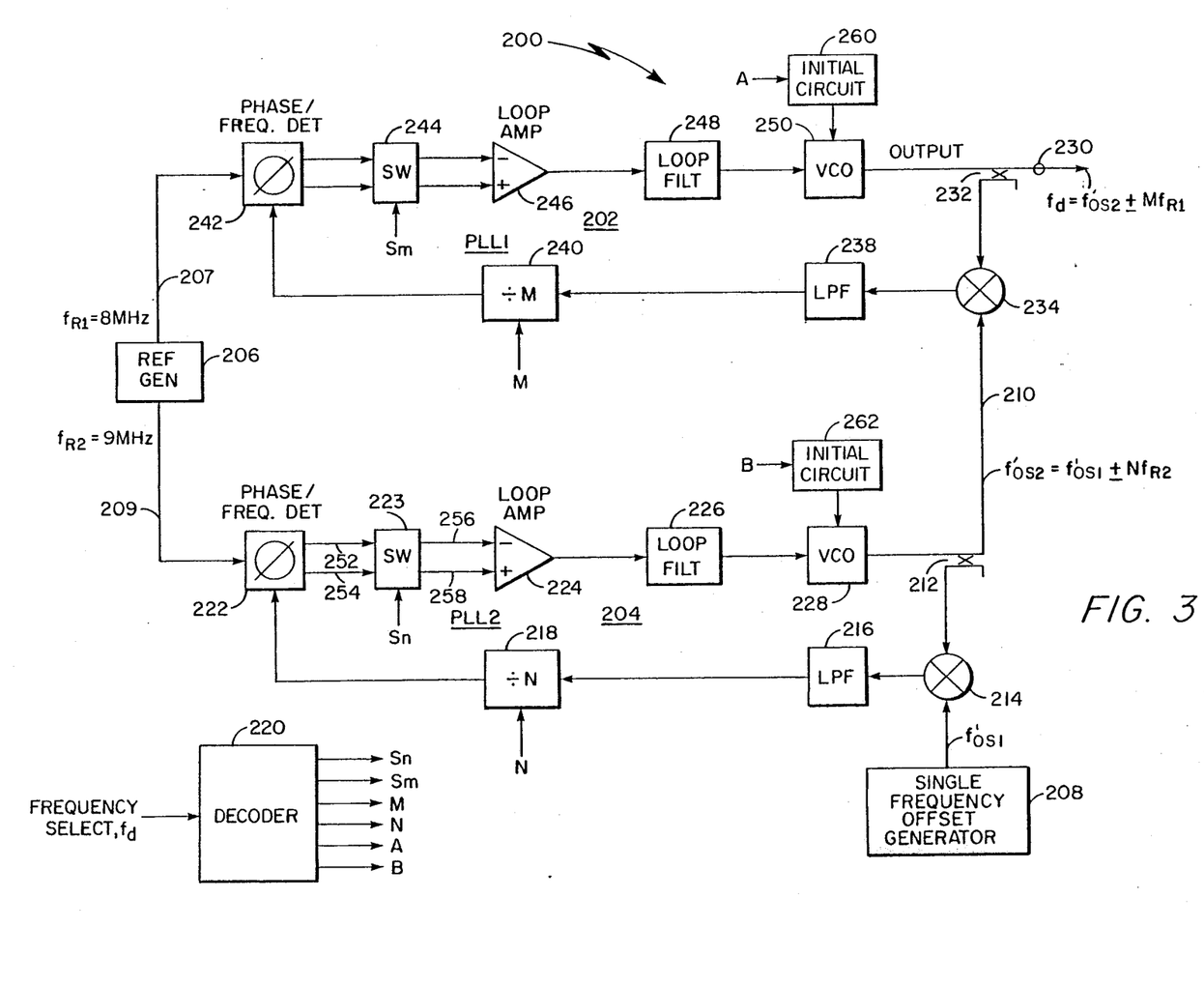
FIG. 3 is a block diagram of a indirect digital frequency synthesizer according to an alternative embodiment of the invention.

Referring now to FIG. 3 an indirect digital frequency synthesizer 200 is shown to include a pair of feedback loops, here phase-lock loop 202, 204 (PLL1, PLL2) adapted to produce an output signal having a selected one of a plurality of frequencies within a band of frequencies with a predetermined frequency separation. Here the second phase-lock loop 204 is fed by a second reference frequency signal produced by a reference frequency generator 206. Here, the reference frequency generator 206 is equivalent to reference frequency generator 113 described above in connection with FIG. 2 and produces the first reference frequency signal with first reference frequency $f_{R1}$, here 8 MHZ, and the second reference frequency signal with a frequency, $f_{R2}$, here 9 MHZ, on lines 207 and 209, respectively. Also fed to the second phase-lock loop 204 is an offset frequency signal having frequency $f'_{os1}$ produced by offset frequency signal generator 208. The second phase-lock loop 204 produces, in the steady state, an output signal on line 210 having a frequency $f'_{os2}=f'_{os1}\pm Nf_{R2}$. More particularly, the second phase-lock loop 204 produces an output signal on line 210 which is equal to the frequency of the offset frequency signal $f'_{os1}$ translated in frequency, either up or down, an amount $Nf_{R2}$ in a manner to be described. Suffice it to say here, however, that a portion of the output signal on line 210 is fed via directional coupler 212 to mixer 214. Also fed to the mixer 214 is the offset frequency signal produced by offset frequency signal generator 208. The beat frequency signal, generated by passing the signal produced by mixer 214 through low pass filter 216, is fed to programmable frequency divider 218. The programmable frequency divider 218 produces an output signal having a frequency equal to the frequency of the beat frequency signal divided by N, where N is an integer. Command signals representative of the integer N are produced by a decoder 220 in response to a digital word representative of the frequency to be synthesized, in a manner to be described. A phase/frequency detector 222 is fed by the second reference frequency signal on line 209 and the signal produced by the frequency divider 218 to produce a control signal which, after passing through switch 223, loop amplifier 224 and loop filter 226 serves to drive the voltage controlled oscillator (VCO) 228, so that, in the steady state, the frequency of the signal produced by the frequency divider 218 will be equal to the second reference frequency $f_{R2}$ thus producing on line 210 an output signal having the frequency $f'_{os2}=f'_{os1}\pm Nf_{R2}$.

A portion of the output signal on line 210 is directly coupled, via directional coupler 212, to provide an offset frequency signal for the first phase-lock loop 202. Also fed to the first phase-lock loop 202 via line 207 is a first reference frequency signal produced by reference frequency generator 206 having a first reference frequency $f_{R1}$, here 8 MHZ. The first phase-lock loop 202 produces, in the steady state, an output signal at port 230 having a frequency $f'_{os2}\pm Mf_{R1}=f'_{os1}\pm Nf_{R2}\pm Mf_{R1}$. More particularly, the first phase-lock loop 202 produces an output signal at port 230 having a frequency equal to the frequency of the offset frequency signal $f'_{os2}$ fed thereto by the second phase-lock loop translated either up or down in frequency an amount $Mf_{R1}$ in a manner to be described. Suffice it to say here, however, that a portion of the output signal at port 230 is fed, via directional coupler 232, to a mixer 234. A portion of the output signal produced by the second phase-lock loop on line 210 passes through directional coupler 212 to mixer 234. The beat frequency signal produced by passing the output of mixer 234 through low pass filter 238 is fed to a programmable frequency divider 240. The programmable frequency divider 240 produces an output signal having a frequency equal to the frequency of the beat frequency signal fed thereto divided by M, where M is an integer. The integer M is produced by decoder 220 in response to the digital word representative of the frequency to be synthesized in a manner to be described. A phase/frequency detector 242 is fed via line 207 by the first reference frequency signal and the signal produced by the frequency divider 240 to produce a control signal which, after passing through switch 244, loop amplifier 246, and loop filter 248 serves to drive voltage controlled oscillator (VCO) 250 so that, in the steady state, the frequency of the signal produced by the frequency divider 240 will be equal to the first reference frequency $f_{R1}$ thus producing on line 230 an output signal having a frequency $f_d=f'_{os2}\pm Mf_{R1}=f'_{os1}\pm Nf_{R2}\pm Mf_{R1}$.

It is noted that here, instead of using an offset frequency $f'_{os1}$ either above the upper or below the lower end of the band of frequencies producible by the second phase-lock loop 204, the offset frequency $f'_{os1}$ provided by generator 208 is either at or near the center of such band of frequencies similar to that described in the copending patent application Ser. No. 07/272,044 referred to above. That is, the offset frequency $f'_{os1}$ produced by generator 208 is at, or near, the center of the range of frequencies produced by VCO 228. Thus, considering first the second phase-lock loop 204, the beat frequency signal produced at the output of low pass filter 216 will have the same beat frequency whether the output signal of the VCO 228 is either $f'_{os1}+Nf_{R2}$ or $f'_{os1}-Nf_{R2}$. Thus, there is an ambiguity because every beat frequency corresponds to two VCO frequencies. This ambiguity is eliminated by the inclusion of a VCO frequency initialization circuit 262. In response to an input signal representative of the desired frequency to be synthesized, decoder 220 produces a signal on line B which causes the initialization circuit 262 to apply an appropriate voltage to the coarse-tuning port of VCO 228 or alternatively, to sum an appropriate voltage with the input (+ or −) of the loop amplifier 224. If the frequency $f'_{os2}$ is to be below the offset frequency $f'_{os1}$, the frequency of the VCO 228 is positioned at some arbitrary frequency in the range between its lowest output frequency and the offset frequency $f'_{os1}$. On the other hand, if the frequency $f'_{os2}$ is to be above the offset frequency $f'_{os1}$, the VCO 228 output frequency is a frequency positioned at some arbitrary frequency in the range between the offset frequency $f'_{os1}$ and the highest VCO 228 producible frequency. Following frequency initialization, the phase/frequency detector 222 acts as a discriminator and develops a control signal that slews the frequency of the VCO 228 from the initialization frequency to the capture range about the frequency $f'_{os2}$. The VCO initialization circuit 262 eliminates the above described frequency ambiguity because the frequency $f'_{os2}$ and the initialization frequency are always on the same side of the offset frequency $f'_{os1}$.

Another factor to be considered because of the frequency ambiguity, (that is because the VCO 228 can produce two frequencies and generate the same beat frequency for the frequency divider 218) is that when the VCO 228 produces frequencies below the offset frequency $f'_{os1}$ the beat frequency decreases as the VCO produced frequency increases whereas when the VCO 228 produces frequencies above the offset frequency $f'_{os1}$ the beat frequency increases as the VCO 228 produced frequencies increase. Since the phase-lock loop 204 cannot be stable with both these relationships the sense (i.e. polarity) of the phase/frequency detector 222 must be changed, or switched, when the frequency $f_{R2}$ is switched from one side of the offset frequency $f'_{os1}$ to the other side to ensure that a negative feedback (degenerative) loop condition exists. That is, if the loop is configured to exhibit negative feedback (stability) when the VCO frequencies are on one side of the offset frequency, then the loop exhibits positive feedback (instability) when VCO frequencies are on the other side of the offset frequency. Under the latter condition, negative feedback is restored by switching (interchanging) the two outputs of the phase/frequency detector which reverses the polarity of the output voltage of the loop amplifier (i.e. error voltage of the loop). This switching is accomplished by the use of switch 223. Switch 223 has a pair of input lines 252, 254 and a pair of output lines 256, 258. A control signal $S_n$ produced by decoder 220, is fed to switch 223. The lines 256, 258 are fed to an inverting (−) input and a non-inverting (+) input, respectively, of loop amplifier 224. In response to one of two states of the control signal $S_n$, input line 252 is coupled to output line 256 and input line 254 is coupled to output line 258. In response to the second state of the control signal $S_n$ input line 252 is coupled to output line 258 and input line 254 is coupled to output line 256. This switching can also be accomplished by switching (i.e. interchanging) the two input signals to the phase/frequency detector 222 or by replacing the mixer 214 with an image rejection mixer followed by a switch as disclosed in the above-mentioned copending patent application where the two outputs of the image rejection mixer correspond to the two frequency ranges of the VCO 228 (below or above the offset frequency $f'_{os1}$).

For similar reasons, more specifically because VCO 250 of the first phase-lock loop 202 can produce two frequencies which produce the same beat frequency for divider 240, a switch 244, responsive to a control signal $S_m$ from decoder 220 is provided to change the sense (i.e. polarity) of the control function provided by loop 202 and a initalization circuit 260 is also provided. The initialization circuit 260 here produces a voltage in response to a control signal produced by decoder 220 on line A which resolves the ambiguity. More particularly, if it is required to synthesize a frequency above the offset frequency $f'_{os2}$ fed to loop 202 via line 210, a voltage is fed to VCO 250 which causes such VCO 250 to produce a signal of an arbitrary frequency above $f'_{os2}$ whereas if it is required to synthesize the frequency below the offset frequency $f'_{os2}$ being fed to loop 202, the voltage fed to VCO 250 causes the VCO 250 to produce an output signal having a frequency below $f'_{os2}$. Following initialization the phase/frequency detector 242 acts as a discriminator and develops an output voltage that slews the frequency of the signal produced by VCO 250 from the initialization frequency to the capture range about the frequency $f_d$.

In response to an input signal representative of the desired frequency to be synthesized, that is the frequency $f_d$, decoder 220 produces signals representative of the integers M and N, control signals $S_n$ and $S_m$, and initialization control signals on lines A and B such that in the steady state, $f_d = f'_{os1} \pm f_T$ where $f_T = \pm N f_{R2} \pm M f_{R1}$.

The program stored in the decoder 220 (which here includes a read only memory), to generate the desired frequency $f_d$ is provided in Table III below:

TABLE III

| | $f_d = f'_{os1} \pm f_T = f'_{os1} + (\pm 9N \pm 8M)MHZ$ | | | | | | | | | | | | | | | | | | | |
|---|---|---|---|---|---|---|---|---|---|---|---|---|---|---|---|---|---|---|---|---|
| | 0 | | 1 | | 2 | | 3 | | 4 | | 5 | | 6 | | 7 | | 8 | | 9 | |
| | M | N | M | N | M | N | M | N | M | N | M | N | M | N | M | N | M | N | M | N |
| $f_{os1} - 200$ | −16 | −8 | | | | | | | | | | | | | | | | | | |
| $f_{os1} - 190$ | −8 | −14 | −7 | −15 | −15 | −8 | −14 | −9 | −13 | −10 | −12 | −11 | −11 | −12 | −10 | −13 | −9 | −14 | −8 | −15 |
| $f_{os1} - 180$ | −9 | −12 | −8 | −13 | −7 | −14 | −15 | −7 | −14 | −8 | −13 | −9 | −12 | −10 | −11 | −11 | −10 | −12 | −9 | −13 |
| $f_{os1} - 170$ | −10 | −10 | −9 | −11 | −8 | −12 | −7 | −13 | −6 | −14 | −14 | −7 | −13 | −8 | −12 | −9 | −11 | −10 | −10 | −11 |
| $f_{os1} - 160$ | −11 | −8 | −10 | −9 | −9 | −10 | −8 | −11 | −7 | −12 | −6 | −13 | −14 | −6 | −13 | −7 | −12 | −8 | −11 | −9 |
| $f_{os1} - 150$ | −12 | −6 | −11 | −7 | −10 | −8 | −9 | −9 | −8 | −10 | −7 | −11 | −6 | −12 | −5 | −13 | −13 | −6 | −12 | −7 |
| $f_{os1} - 140$ | −4 | −12 | −12 | −5 | −11 | −6 | −10 | −7 | −9 | −8 | −8 | −9 | −7 | −10 | −6 | −11 | −5 | −12 | −13 | −5 |
| $f_{os1} - 130$ | −5 | −10 | −4 | −11 | −12 | −4 | −11 | −5 | −10 | −6 | −9 | −7 | −8 | −8 | −7 | −9 | −6 | −10 | −5 | −11 |
| $f_{os1} - 120$ | −6 | −8 | −5 | −9 | −4 | −10 | −3 | −11 | −11 | −4 | −10 | −5 | −9 | −6 | −8 | −7 | −7 | −8 | −6 | −9 |
| $f_{os1} - 110$ | −7 | −6 | −6 | −7 | −5 | −8 | −4 | −9 | −3 | −10 | −11 | −3 | −10 | −4 | −9 | −5 | −8 | −6 | −7 | −7 |
| $f_{os1} - 100$ | −8 | −4 | −7 | −5 | −6 | −6 | −5 | −7 | −4 | −8 | −3 | −9 | −2 | −10 | −10 | −3 | −9 | −4 | −8 | −5 |
| $f_{os1} - 90$ | −9 | −2 | −8 | −3 | −7 | −4 | −6 | −5 | −5 | −6 | −4 | −7 | −3 | −8 | −2 | −9 | −10 | −2 | −9 | −3 |
| $f_{os1} - 80$ | −1 | −8 | −9 | −1 | −8 | −2 | −7 | −3 | −6 | −4 | −5 | −5 | −4 | −6 | −3 | −7 | −2 | −8 | −1 | −9 |
| $f_{os1} - 70$ | −2 | −6 | −1 | −7 | −9 | −16 | −8 | −1 | −7 | −2 | −6 | −3 | −5 | −4 | −4 | −5 | −3 | −6 | −2 | −7 |
| $f_{os1} - 60$ | −3 | −4 | −2 | −5 | −1 | −6 | −9 | 1 | 1 | −8 | −7 | −1 | −6 | −2 | −5 | −3 | −4 | −4 | −3 | −5 |
| $f_{os1} - 50$ | −4 | −2 | −3 | −3 | −2 | −4 | −1 | −5 | −9 | 2 | 1 | −7 | 2 | −8 | −6 | −1 | −5 | −2 | −4 | −3 |
| $f_{os1} - 40$ | 4 | −8 | −4 | −1 | −3 | −2 | −2 | −3 | −1 | −4 | −9 | 3 | 1 | −6 | −7 | 1 | 3 | −8 | −5 | −1 |
| $f_{os1} - 30$ | −6 | 2 | −5 | 1 | 5 | −8 | −3 | −1 | −2 | −2 | −1 | −3 | −9 | 4 | 1 | −5 | 2 | −6 | −6 | 1 |
| $f_{os1} - 20$ | 2 | −4 | 3 | −5 | −5 | 2 | −4 | 1 | 6 | −8 | −2 | −1 | −1 | −2 | −9 | 5 | 1 | −4 | 2 | −5 |
| $f_{os1} - 10$ | 1 | −2 | 2 | −3 | 3 | −4 | −5 | 3 | −4 | 2 | −3 | 1 | 7 | −8 | −1 | −1 | −9 | 6 | 1 | −3 |
| $f_{os1} - 0$ | −9 | 8 | 1 | −1 | 2 | −2 | 3 | −3 | 4 | −4 | −4 | 3 | −3 | 2 | −2 | 1 | 8 | −8 | −9 | 7 |
| $f_{os1} + 0$ | −9 | 8 | −1 | 1 | −2 | 2 | −3 | 3 | −4 | 4 | 4 | −3 | 3 | −2 | 2 | −1 | −8 | 8 | 9 | −7 |
| $f_{os1} + 10$ | −1 | 2 | 3 | −2 | −3 | 4 | 5 | −3 | 4 | −2 | 3 | −1 | −7 | 8 | 1 | 1 | 9 | −6 | −1 | 3 |
| $f_{os1} + 20$ | −2 | 4 | −3 | 5 | 5 | −2 | 4 | −1 | −6 | 8 | 2 | 1 | 1 | 2 | 9 | −5 | −1 | 4 | −2 | 5 |
| $f_{os1} + 30$ | 6 | −2 | 5 | −1 | −5 | 8 | 3 | 1 | 2 | 2 | 1 | 3 | 9 | −4 | −1 | 5 | −2 | 6 | 6 | −1 |
| $f_{os1} + 40$ | −4 | 8 | 4 | 1 | 3 | 2 | 2 | 3 | 1 | 4 | 9 | −3 | −1 | 6 | 7 | −1 | −3 | 8 | 5 | 1 |
| $f_{os1} + 50$ | 4 | 2 | 3 | 3 | 2 | 4 | 1 | 5 | 9 | −2 | −1 | 7 | −2 | 8 | 6 | 1 | 5 | 2 | 4 | 3 |
| $f_{os1} + 60$ | 3 | 4 | 2 | 5 | 1 | 6 | 9 | −1 | −1 | 8 | 7 | 1 | 6 | 2 | 5 | 3 | 4 | 4 | 3 | 5 |
| $f_{os1} + 70$ | 2 | 6 | 1 | 7 | −9 | 16 | 8 | 1 | 7 | 2 | 6 | 3 | 5 | 4 | 4 | 5 | 3 | 6 | 2 | 7 |
| $f_{os1} + 80$ | 1 | 8 | 9 | 1 | 8 | 2 | 7 | 3 | 6 | 4 | 5 | 5 | 4 | 6 | 3 | 7 | 2 | 8 | 1 | 9 |
| $f_{os1} + 90$ | 9 | 2 | 8 | 3 | 7 | 4 | 6 | 5 | 5 | 6 | 4 | 7 | 3 | 8 | 2 | 9 | 10 | 2 | 9 | 3 |
| $f_{os1} + 100$ | 8 | 4 | 7 | 5 | 6 | 6 | 5 | 7 | 4 | 8 | 3 | 9 | 2 | 10 | 10 | 3 | 9 | 4 | 8 | 5 |
| $f_{os1} + 110$ | 7 | 6 | 6 | 7 | 5 | 8 | 4 | 9 | 3 | 10 | 11 | 3 | 10 | 4 | 9 | 5 | 8 | 6 | 7 | 7 |
| $f_{os1} + 120$ | 6 | 8 | 5 | 9 | 4 | 10 | 3 | 11 | 11 | 4 | 10 | 5 | 9 | 6 | 8 | 7 | 7 | 8 | 6 | 9 |
| $f_{os1} + 130$ | 5 | 10 | 4 | 11 | 12 | 4 | 11 | 5 | 10 | 6 | 9 | 7 | 8 | 8 | 7 | 9 | 6 | 10 | 5 | 11 |
| $f_{os1} + 140$ | 4 | 12 | 12 | 5 | 11 | 6 | 10 | 7 | 9 | 8 | 8 | 9 | 7 | 10 | 6 | 11 | 5 | 12 | 13 | 5 |
| $f_{os1} + 150$ | 12 | 6 | 11 | 7 | 10 | 8 | 9 | 9 | 8 | 10 | 7 | 11 | 6 | 12 | 5 | 13 | 13 | 6 | 12 | 7 |

TABLE III-continued

| | $f_d = f'_{osl} \pm f_T = f'_{osl} + (\pm 9N \pm 8M)MHZ$ | | | | | | | | | | | | | | | | | | |
|---|---|---|---|---|---|---|---|---|---|---|---|---|---|---|---|---|---|---|---|
| | 0 | | 1 | | 2 | | 3 | | 4 | | 5 | | 6 | | 7 | | 8 | | 9 |
| | M | N | M | N | M | N | M | N | M | N | M | N | M | N | M | N | M | N | M | N |
| $f'_{osl}+160$ | 11 | 8 | 10 | 9 | 9 | 10 | 8 | 11 | 7 | 12 | 6 | 13 | 14 | 6 | 13 | 7 | 12 | 8 | 11 | 9 |
| $f'_{osl}+170$ | 10 | 10 | 9 | 11 | 8 | 12 | 7 | 13 | 6 | 14 | 14 | 7 | 13 | 8 | 12 | 9 | 11 | 10 | 10 | 11 |
| $f'_{osl}+180$ | 9 | 12 | 8 | 13 | 7 | 14 | 15 | 7 | 14 | 8 | 13 | 9 | 12 | 10 | 11 | 11 | 10 | 12 | 9 | 13 |
| $f'_{osl}+190$ | 8 | 14 | 7 | 15 | 15 | 8 | 14 | 9 | 13 | 10 | 12 | 11 | 11 | 12 | 10 | 13 | 9 | 14 | 8 | 15 |
| $f'_{osl}+200$ | 16 | 8 | | | | | | | | | | | | | | | | | | |

It is first noted that negative (−) division ratios of N, M correspond to frequencies produced by VCO 228, VCO 250, respectively, below the offset frequencies $f'_{os1}$, $f'_{os2}$, respectively, while all positive frequency division ratios N, M correspond to frequencies produced by VCO 228, VCO 250, respectively, above the offset frequencies $f'_{os1}$, $f'_{os2}$, respectively. Thus, for example, if the desired frequency $f_d$ to be synthesized is $f'_{os1}+64$ MHZ, from Table III M=−1 and N=8. Thus, the frequency of the signal produced by VCO 228 is above the offset frequency $f'_{os1}$ but the frequency of the signal produced by VCO 250 is below the offset frequency $f'_{os2}$. Thus, as noted above, $f_d=f'_{os1}+9N+8M$. Here M=−1 and N=8, thus $f_d=f'_{os1}+(9)(8)+8(−1)=f'_{os1}+64$ MHZ. Whereas if $f_d=f'_{os1}−64$ MHZ, then, from Table III, M=1 and N=−8. Further, if $f_d=f'_{os1}+2$ MHZ, M=−2 and N=2; whereas if $f_d=f'_{os1}−2$ MHZ, M=2 and N=−2. Finally, if $f_d=f'_{os1}$, then M=−9 and N=8.

Having described preferred embodiments of this invention, it is evident that other embodiments incorporating these concepts may be used. For example, other reference frequency signals may be used. Other frequency separations may be used. It is felt, therefore, that this invention should not be restricted to the disclosed embodiments, but rather should be limited only by the spirit and scope of the appended claims.

What is claimed is:

1. Apparatus for producing a signal having a selected one of a plurality of frequencies, each one of such plurality of frequencies being separated in frequency one from another an amount Δ f, such apparatus comprising:

(a) reference frequency oscillator means for producing a first and a second reference frequency signals having frequencies $f_{R1}$, $f_{R2}$, respectively, such frequencies being separated in frequency by the amount Δ f;

(b) second phase-lock loop means, having: a second frequency divider means, responsive to a second control signal, for dividing a signal by a division ratio N; and, and offset generator for producing an offset reference frequency signal, such second phase-lock loop means being fed by the second reference frequency signal having the frequency $f_{R2}$ and the offset reference frequency signal, for producing an output signal having a frequency equal to the offset frequency translated by an amount proportional to $Nf_{R2}$;

(c) first phase-lock loop means, having a first frequency divider means, responsive to a first control signal, for dividing a signal by a division ratio M, such first phase-lock loop means being fed by the output of the second phase-lock loop means and the first reference signal having the frequency $f_{R1}$, for producing a signal having a frequency equal to the frequency of the output signal produced by the second phase-lock loop translated by an amount proportional to $Mf_{R1}$; and (d) decoder means, responsive to the selected frequency for producing the first and second control signals representative of M and N, respectively.

2. Apparatus for producing, at an output thereof, an output signal having a selected one of a plurality of frequencies, such plurality of frequencies being separated in frequency an amount Δ f, such apparatus comprising:

(a) reference frequency producing means for producing a pair of reference frequency signals, a first one of the pair of produced reference frequency signals having a frequency $f_{R1}$ and a second one of the pair of produced reference frequency signals having a frequency $f_{R2}$, the frequencies $f_{R1}$ and $f_{R2}$ being greater than the amount Δ f;

(b) a second feedback loop means, fed by the second one of the pair of produced reference frequency signals, for producing a second feedback loop output signal having a frequency $f_{os2}$ where $f_{os2}$ is a function of an integer multiple of the frequency $f_{R2}$;

(c) a first feedback loop means, fed by the first one of the pair of produced reference frequency signals and by the second feedback loop output signal, for producing a signal having a frequency, $f_d$, translated in frequency from the frequency $f_{os2}$ an integer multiple of the frequency $f_{R1}$, such signal being coupled to the output of the apparatus.

3. The apparatus recited in claim 2 wherein frequencies $f_{R1}$ and $f_{R2}$ are separated by an amount related to the amount Δ f.

4. The apparatus recited in claim 3 wherein the frequencies $f_{R1}$ and $f_{R2}$ are separated by the amount Δ f.

5. The apparatus recited in claim 4 wherein the frequency $f_{os2}$ is related to an integer multiple N of the frequency $f_{R2}$.

6. The apparatus recited in claim 4 wherein the frequency produced by the apparatus is translated from the frequency $f_{os2}$ an integer multiple M of the frequency $f_{R1}$.

7. The apparatus recited in claim 5 wherein the second feedback loop means is red by an offset frequency signal of frequency $f_{os1}$ and wherein the second feedback loop output signal has a frequency $f_{os2}$ translated in frequency from $f_{os1}$ an amount $Nf_{R2}$.

8. The apparatus recited in claim 7 wherein the first and second feedback loop means each includes a frequency divider means for dividing by M and N, respectively.

9. Apparatus for producing a signal having a selected one of a plurality of frequencies, such frequencies being in a spectrum of frequencies over a predetermined bandwith, the frequencies in such spectrum having a predetermined frequency separation Δ f, such apparatus comprising:

(a) means for producing a pair of reference frequency signals separated in frequency by the predetermined frequency separation $\Delta f$, a first one of such pair of reference frequency signals having a frequency $f_{R1}$ and a second one of the pair of reference frequency signals having a frequency $f_{R2}$, and wherein the frequencies, $f_{R1}$ and $f_{R2}$ are greater than the predetermined frequency separation $\Delta f$;

(b) means for producing a predetermined offset frequency signal, such signal having a frequency $f_{os1}$;

(c) a second phase-lock loop means for producing a second phase-lock loop output signal having a frequency $f_{os2}$ equal to the frequency $f_{os1}$ translated in frequency by an amount $Nf_{R2}$, such second phase-lock loop means comprising:

(i) a second mixer means, fed by the offset frequency producing means and the second phase-lock loop output signal, for producing a second mixer output signal having the frequency $f_{T2}$;

(ii) a second frequency divider means, fed by the second mixer output signal and responsive to a second control signal representing a second integer N, for producing a signal having a frequency $f_N$, where $f_N = f_{T2}/N$;

(iii) second loop output producing means, including second phase detector means, responsive to the signal produced by the second frequency divider means and the second one of the pair of reference frequency signals, for maintaining, in a steady state condition, the frequency $f_N$ equal to the second reference frequency $f_{R2}$, for producing the second phase-lock loop output signal with the frequency $f_{os2}$ equal to the frequency of the offset frequency $f_{os1}$ translated an amount equal to $f_{T2}$;

(d) a first phase-lock loop means for producing the signal produced by the apparatus having a frequency $f_d$ equal to the frequency $f_{os2}$ translated in frequency an amount $f_{T1}$, such first phase-lock loop means comprising:

(i) a first mixer means, fed by the signal produced by the second phase-lock loop means having the frequency $f_{os2}$ and by the signal produced by the apparatus, for producing a first mixer output signal having a frequency $f_{T1}$;

(ii) a first frequency divider means, fed by the first mixer output signal and responsive to a first control signal representing a first integer M, for producing a signal having a frequency $f_M$, where $f_M = f_{T1}/M$;

(iii) first loop output producing means, including first phase detector means, responsive to the signal produced by the first frequency divider means and the first one of the pair of reference frequency signals, for maintaining, in a steady state condition, the frequency $f_M$ equal to the first reference frequency $f_{R1}$, for producing the apparatus output signal having the selected one of the plurality of frequencies; and (d) decoder means, responsive to a signal representative of the selected one of the plurality of frequencies, for producing first and second control signals representative of the integers M and N.

10. The apparatus recited in claim 9 wherein each of the first and the second phase detector means produces a first and a second oscillator signal, respectively, and wherein each one of the first and second loop output producing means includes a voltage-controlled oscillator responsive to a corresponding one of the first and second oscillator control signals.

* * * * *